US012666648B2

(12) United States Patent
Bao et al.

(10) Patent No.: US 12,666,648 B2
(45) Date of Patent: Jun. 23, 2026

(54) ENABLING ANNEAL FOR RELIABILITY IMPROVEMENT AND MULTI-VT WITH INTERFACIAL LAYER REGROWTH SUPPRESSION

(71) Applicant: INTERNATIONAL BUSINESS MACHINES CORPORATION, Armonk, NY (US)

(72) Inventors: Ruqiang Bao, Niskayuna, NY (US); Huiming Bu, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 104 days.

(21) Appl. No.: 17/718,989

(22) Filed: Apr. 12, 2022

(65) Prior Publication Data
US 2022/0238682 A1     Jul. 28, 2022

Related U.S. Application Data

(62) Division of application No. 15/995,887, filed on Jun. 1, 2018, now Pat. No. 11,329,136.

(51) Int. Cl.
| | |
|---|---|
| *H10D 30/67* | (2025.01) |
| *H10D 62/10* | (2025.01) |
| *H10D 64/01* | (2025.01) |
| *H10D 84/01* | (2026.01) |
| *H10D 84/03* | (2025.01) |
| *H10D 84/85* | (2025.01) |
| *H10P 14/20* | (2026.01) |

(52) U.S. Cl.
CPC ....... *H10D 30/6735* (2025.01); *H10D 62/118* (2025.01); *H10D 64/01354* (2026.01); *H10D 64/017* (2025.01); *H10D 84/0172* (2025.01);

*H10D 84/0193* (2025.01); *H10D 84/038* (2025.01); *H10D 84/853* (2025.01); *H10P 14/3462* (2026.01)

(58) Field of Classification Search
CPC ......... H01L 29/42392; H01L 21/02603; H01L 21/28247; H01L 21/823821; H01L 21/823828; H01L 27/0924; H01L 29/0665; H01L 29/66545; H10D 30/6735; H10D 62/118; H10D 64/017; H10D 84/0172; H10D 84/0193; H10D 84/038; H10D 84/853; H10D 64/01354; H10P 14/3462
See application file for complete search history.

(56) References Cited

U.S. PATENT DOCUMENTS

| | | | |
|---|---|---|---|
| 7,993,995 | B2 | 8/2011 | Majumdar et al. |
| 8,138,076 | B2 | 3/2012 | Lin et al. |
| 8,716,812 | B2 | 5/2014 | Mueller et al. |
| (Continued) | | | |

OTHER PUBLICATIONS

List of IBM Patents or Patent Applications Treated as Related dated Apr. 12, 2022, 2 pages.

*Primary Examiner* — Benjamin Tzu-Hung Liu
(74) *Attorney, Agent, or Firm* — Harrity & Harrity, LLP

(57) ABSTRACT

A method for fabricating a semiconductor device includes forming an interfacial layer and a dielectric layer on a base structure and around channels of a first gate-all-around field-effect transistor (GAA FET) device within a first region and a second GAA FET device within a second region, forming at least a scavenging metal layer in the first and second regions, and performing an anneal process after forming at least one cap layer.

19 Claims, 9 Drawing Sheets

(56) References Cited

U.S. PATENT DOCUMENTS

| | | | |
|---|---|---|---|
| 9,349,823 B2 | 5/2016 | Choi | |
| 9,660,033 B1 * | 5/2017 | Chen | H10D 30/751 |
| 9,741,720 B1 | 8/2017 | Siddiqui et al. | |
| 10,332,803 B1 * | 6/2019 | Xie | H10D 84/0167 |
| 11,329,136 B2 | 5/2022 | Bao et al. | |
| 2012/0187523 A1 * | 7/2012 | Cummings | H10D 84/038 |
| | | | 257/E21.546 |
| 2015/0243662 A1 | 8/2015 | Ando et al. | |
| 2017/0047420 A1 | 2/2017 | Chen et al. | |
| 2017/0110595 A1 * | 4/2017 | Sengupta | H01L 29/0673 |
| 2018/0374926 A1 * | 12/2018 | Lee | H10D 64/671 |
| 2019/0318967 A1 * | 10/2019 | Chen | H10D 62/235 |
| 2019/0348498 A1 * | 11/2019 | Cheng | H10D 62/121 |
| 2023/0317790 A1 * | 10/2023 | Chuang | H10D 30/43 |
| | | | 257/288 |

* cited by examiner 300
232
250
260
262
230
212
210
302          FIG. 19          304
300
232
250
260
230
212
210
302          FIG. 20          304
300
232
250
260
310
230
212
210
302          FIG. 21          304
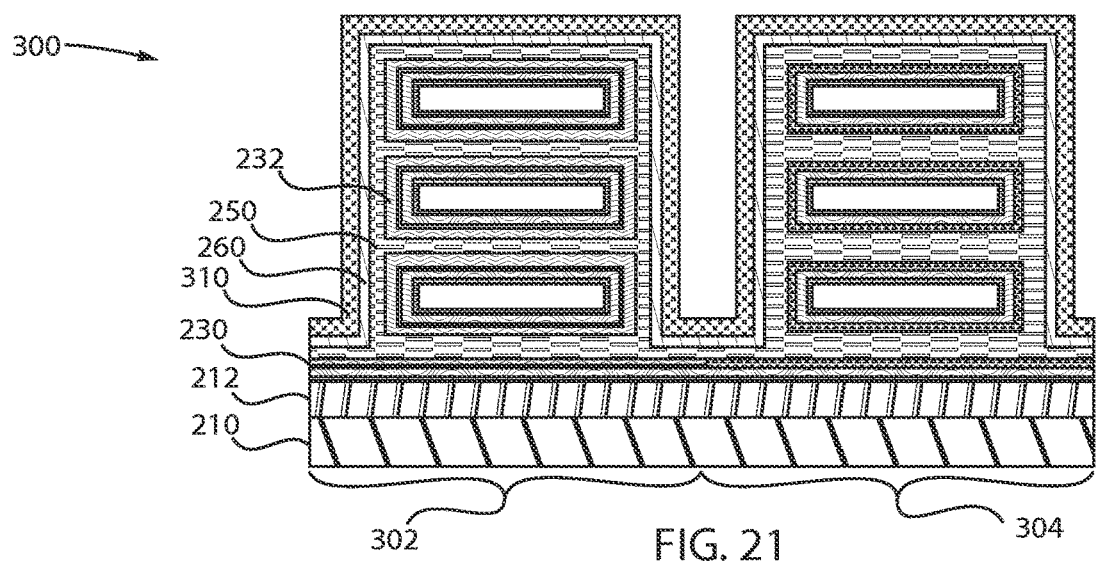

ENABLING ANNEAL FOR RELIABILITY IMPROVEMENT AND MULTI-VT WITH INTERFACIAL LAYER REGROWTH SUPPRESSION

BACKGROUND

Technical Field

The present invention generally relates to semiconductor devices, and more particularly to gate-all-around field-effect transistor devices and methods of fabricating the same.

Description of the Related Art

A gate-all-around (GAA) field effect transistor (FET) is a FET in which the gate is placed on all four sides of a channel of the FET. GAA FETs can reduce problems associated with channel width variations, including but not limited to undesired variability and mobility loss.

SUMMARY

In accordance an embodiment of the present invention, a method for fabricating a semiconductor device is provided. The method includes forming an interfacial layer and a dielectric layer on a base structure and around channels of a first gate-all-around field-effect transistor (GAA FET) device within a first region and a second GAA FET device within a second region, forming at least a scavenging metal layer in the first and second regions, and performing an anneal process after forming at least one cap layer.

In accordance with another embodiment of the present invention, a semiconductor device providing a multiple threshold voltage (Vt) scheme is provided. The device includes a first gate-all-around field-effect transistor (GAA FET) device. The first GAA FET device includes a plurality of first channels, a dipole layer around the plurality of first channels, and a first work function metal pinching off gaps between the plurality of first channels. The device further includes a second GAA FET device disposed on the base structure in a second region and associated with a second Vt. The second GAA FET device includes a plurality of second channels, a second work function metal pinching off gaps between the plurality of second channels, and the first work function metal on the second work function metal. The device further includes a gate electrode on the first work function metal.

In accordance with yet another embodiment of the present invention, a semiconductor device providing a multiple threshold voltage (Vt) scheme is provided. The device includes a first gate-all-around field-effect transistor (GAA FET) device. The first GAA FET device includes a plurality of first channels, a dipole layer around the plurality of first channels, a first barrier layer on the dipole layer, a scavenging metal layer on the first barrier layer, and a wetting layer on the scavenging metal layer around the plurality of first channels. The device further includes a second GAA FET device disposed on the base structure in a second region and associated with a second Vt. The second GAA FET device includes a plurality of second channels, a second barrier layer on the plurality of second channels, the scavenging metal layer on the second barrier layer, and the wetting layer on the scavenging metal layer. The device further includes a gate electrode on the wetting layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 19 is a cross-sectional view of the semiconductor device of FIG. 16, in accordance with an alternative embodiment of the present invention;

FIG. 20 is a cross-sectional view of the removal of the at least one cap layer after an anneal process is performed during the fabrication of the semiconductor device, in accordance with an alternative embodiment of the present invention;

FIG. 21 is a cross-sectional view of a wetting layer formed during the fabrication of the semiconductor device, in accordance with an alternative embodiment of the present invention;

DETAILED DESCRIPTION

Figures 1, 2, 3:
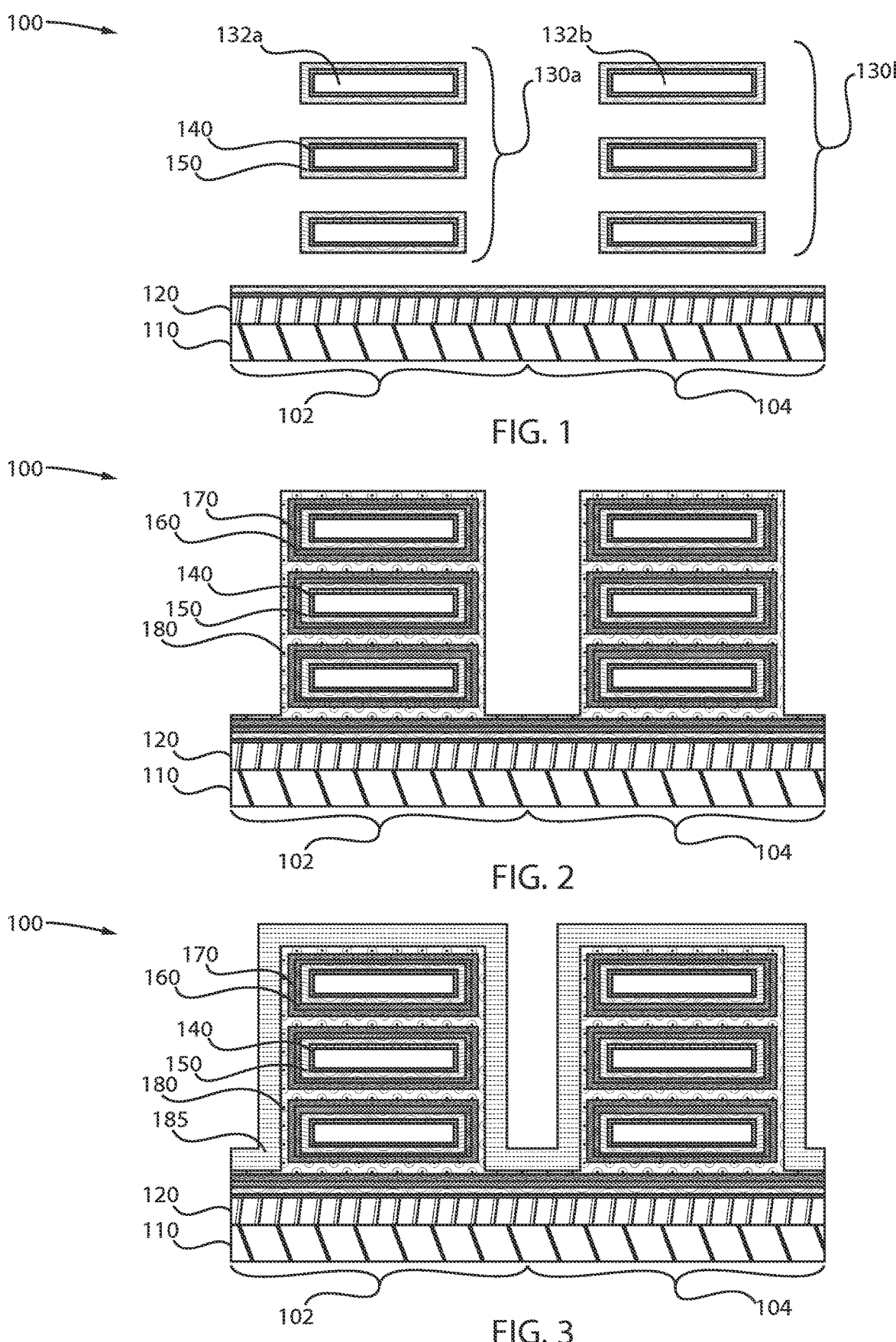
FIG. 1 is a cross-sectional view of an interfacial layer and dielectric layer formed on channels of gate stacks of devices during the fabrication of a semiconductor device, in accordance with an embodiment of the present invention.
FIG. 2 is a cross-sectional view of a scavenging metal stack formed on the dielectric layer during the fabrication of the semiconductor device, in accordance with an embodiment of the present invention.
FIG. 3 is a cross-sectional view of a cap layer formed on the scavenging metal stack during the fabrication of the semiconductor device, in accordance with an embodiment of the present invention.

Aspects of the present embodiments can provide for a stack used to pinch off the space or gap between channels of a gate stack (e.g., nanosheets) of a semiconductor device. In one embodiment, the semiconductor device includes a gate-all-around field-effect transistor (GAA FET) device. For example, the semiconductor device can include a CMOS device having a first device region and a second device region each corresponding to a respective GAA FET. The stack can include a scavenging metal layer for removing or reducing oxygen in oxidized layers between the channels. Higher temperature and longer (wet) etch processes can be used to remove metals between the sheets without patterning boundary concerns due to blanket etch so that reliability anneal can be implemented for the semiconductor device. Further aspects of the present embodiments can provide for multi-Vt schemes to achieve interfacial layer (IL) regrowth suppression. For example, Vt shift can be achieved for a p-type field-effect transistor (pFET) device of a complementary metal-oxide-semiconductor (CMOS) device.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements, FIGS. 1-6 depict respective steps of a process flow for fabricating a semiconductor device to enable annealing for reliability improvement.

Referring to FIG. 1, a cross-sectional view is provided showing an exemplary semiconductor device 100 having regions 102 and 104. As will be described in further detail, a first GAA FET device will be formed in region 102 and a second GAA FET device will be formed in region 104. In one embodiment, the devices in regions 102 and 104 can form a CMOS device. For example, the region 102 can be associated with an n-type MOS (NMOS) device (e.g., nFET) and the region 104 can be associated with a p-type MOS (PMOS) device (e.g., pFET). Although only two regions 102 and 104 are shown in this illustrative embodiment, the device 100 can include additional regions.

As shown, the device 100 includes a base structure including a substrate 110 and an isolator layer 120. The substrate 110 can include any suitable substrate structure, e.g., a bulk semiconductor, a semiconductor-on-insulator (SOI) substrate, etc. In one example, the substrate 110 can include a silicon-containing material. Illustrative examples of Si-containing materials suitable for the substrate 110 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc. The isolator layer 120 can include any suitable material in accordance with the embodiments described herein. For example, the isolator layer 120 can include a suitable dielectric material.

The device further includes a gate stack 130a including a plurality of channels (e.g., channel 130a) formed in region 102, and a gate stack 130b including a plurality of channels (e.g., channel 130b) formed in region 104. In one embodiment, the gate stacks 130a and 130b include nanosheets. One or more of the channels can include Si. However, any material suitable for use as a channel material can be used in accordance with the embodiments described herein. The channels of the gate stacks 130a and 130b have surrounding material removed, but are supported at locations not depicted in the cross-sectional view. Although three channels are shown in each region 102 and 104, the number of channels in each region 102 and 104 should not be considered limited. Moreover, although the regions 102 and 104 are each shown including an equal number of channels, in some embodiments, the number of channels in region 102 can be different from the number of channels in region 104.

As further shown, an interfacial layer (IL) 140 is formed around each of the channels and on the isolator layer 120, and a dielectric layer 150 is formed on the IL 140. The IL 140 can include any material suitable for use as an IL. Such materials may include, but are not limited to, silicon dioxide ($SiO_2$), hafnium silicates, and silicon oxynitrides. The dielectric layer 150 can include a high-k dielectric material, although any type of dielectric material can be used in accordance with the embodiments described herein. A high-k dielectric material is a dielectric material having a dielectric constant (k) higher than the dielectric constant of silicon dioxide ($SiO_2$) at room temperature (e.g., about 20° C.-25° C.) and atmospheric pressure (about 1 atm). Some examples of high-k dielectric materials suitable for the dielectric layer 120 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In some embodiments, the high-k dielectric employed for the high-k gate dielectric layer 15 is selected from the group consisting of hafnium oxide ($HfO_2$), zirconium oxide ($ZrO_2$), aluminum oxide ($Al_2O_3$), hafnium silicate (HfSiO), nitrided hafnium silicate (HfSiON), hafnium oxynitride ($HfO_xN_y$), lanthanum oxide ($La_3O_2$), lanthanum aluminate ($LaAlO_3$), zirconium silicate ($ZrSiO_x$) and combinations thereof. The IL 140 and the dielectric layer 150 can be formed employing any deposition process and/or etching process suitable for use in accordance with the embodiments described herein.

Referring to FIG. 2, a stack including a scavenging metal layer 170 formed between layers 160 and 180 is formed on the dielectric layer 150. The scavenging metal layer 170 includes a metal capable of scavenging oxygen between the channels of the gate stacks 130a and 130b. The scavenging metal layer 170 can include any suitable oxygen-scavenging material in accordance with the embodiments described herein. For example, the scavenging metal layer 170 can include, e.g., aluminum (Al), titanium (Ti), TiAl, a titanium aluminum carbide (e.g., TiAlC), other Al containing materials, other Ti containing materials, etc. In one embodiment, the scavenging metal layer 170 has a thickness ranging from, e.g., about 0.5 nm to about 4 nm.

The layer 160 functions as a barrier layer to suppress diffusion of material from the scavenging metal layer 170. The layer 180 is used as sacrificial cap layer to prevent oxidation of the scavenging metal layer 170 and prevent the interaction between scavenging metal layer 170 and the downstream layer. In one embodiment, the layers 160 and 180 include a nitride. For example, one or more of the layers 160 and 180 can include titanium nitride (e.g., TiN). However, the layers 160 and 180 can include any suitable material in accordance with the embodiments described herein. As shown, the stack of layers 160-180 pinches off the space or gap between the channels of the gate stacks 130a and 130b. In one embodiment, the layers 160 and 180 have a thickness ranging from, e.g., about 0.5 nm to about 2 nm.

Referring to FIG. 3, a cap layer 185 is formed on the layer 180 to protect the IL being regrown in the regions 102 and 104 during a subsequent anneal process. The cap layer 185 can include any suitable material in accordance with the embodiments described herein. For example, the cap layer 185 can include a material like amorphous Si.

Figures 4, 5, 6:
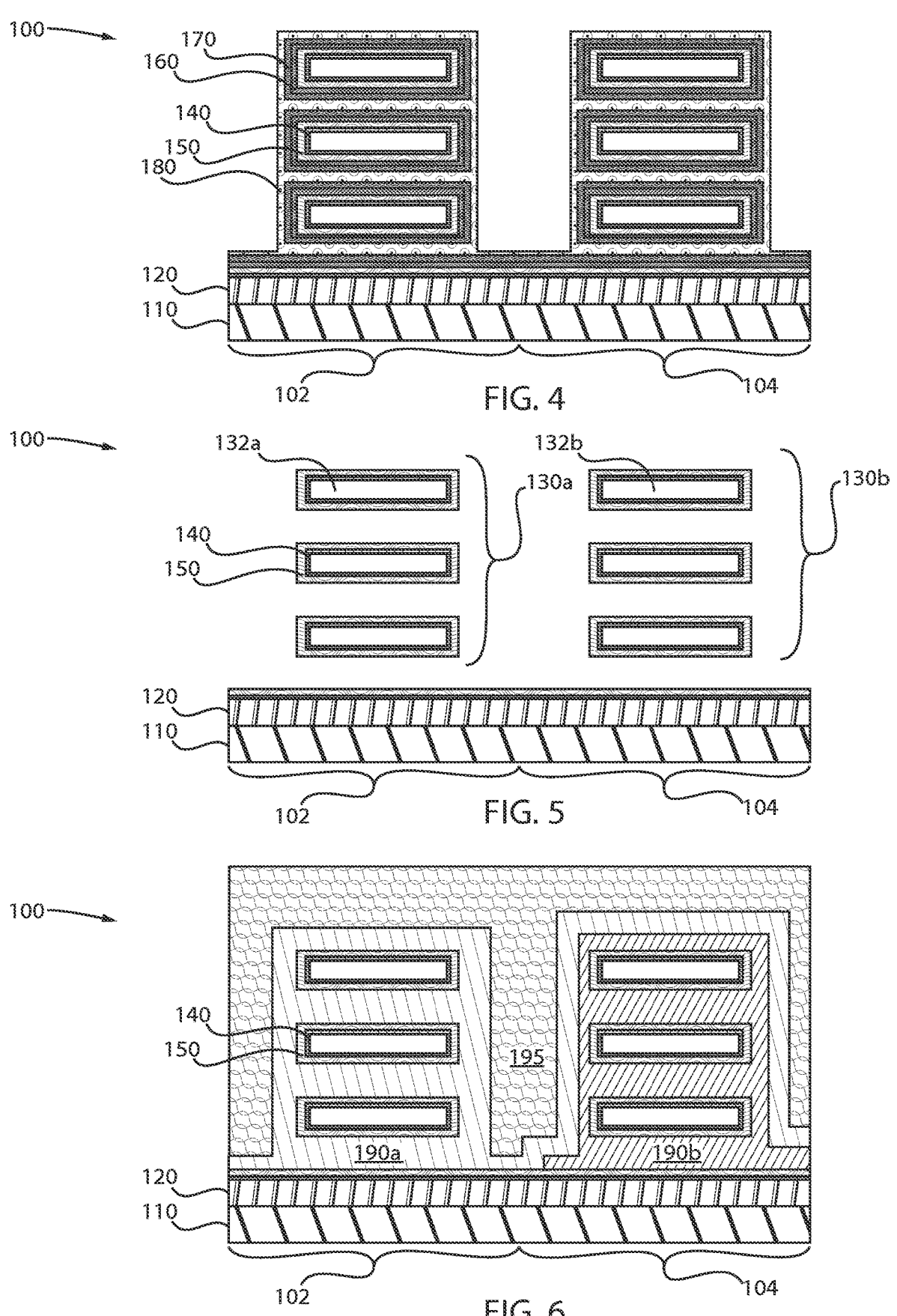
FIG. 4 is a cross-sectional view of the removal of the cap layer after an anneal process is performed during the fabrication of the semiconductor device, in accordance with an embodiment of the present invention.
FIG. 5 is a cross-sectional view of the removal of the scavenging metal stack during the fabrication of the semiconductor device, in accordance with an embodiment of the present invention.
FIG. 6 is a cross-sectional view of dual work function metal and gate electrode formation during the fabrication of the semiconductor device, in accordance with an embodiment of the present invention.

Referring to FIG. 4, the cap layer 185 is removed after an anneal process is performed. The cap layer 185 can be removed by any suitable process in accordance with the embodiments described herein (e.g., wet and/or dry etch). The anneal process can include reliability annealing. In one embodiment, the anneal process employs spike annealing within the temperature range of 700° C. to 1000° C. However, any suitable anneal process can be employed in accordance with the embodiments described herein.

Referring to FIG. 5, the layers 160-180 are removed. The layers 160-180 can be removed by etching the layers 160 and 180 and the scavenging metal layer 170 together. Since the layers 160-180 can be removed together, the removal of the layers 160-180 in accordance with the embodiments described herein can be easier than the removal of stacks including a-Si or a-Si-like layers between the gap.

Referring to FIG. 6, a dual work function metal (WFM) formation process is performed. For example, as shown, WFM 190b is formed on the dielectric layer 150 to pinch off the space or gap between the channels formed in region 104 and WFM 190a is formed on the dielectric layer 150 to pinch off the space or gap between the channels formed in region 102. In one embodiment, the WFM 190a includes an n-type WFM (NWFM) and the WFM 190b includes a p-type WFM (PWFM). The WFM 190a could be composed of a stack including a barrier nitride layer (e.g., titanium nitride (TiN)) and a scavenging metal (e.g., Ti, Al, TaAl, TiAl, TaAlC, TiAlC. In one embodiment, a thicker nWFM, such as Ti, Al, TiAl, TaAl, TaAlC, and TiAlC, is used to pinch off between the nanosheet. The WFM 190b can include a metal nitride e.g., TiN or TaN. Moreover, the WFMs 190a and 190b can be formed using any suitable process in accordance with the embodiments described herein. Additionally, a gate electrode 195 can be formed on the WFM layers 190a and 190b. The gate electrode 195 can include any suitable material in accordance with the embodiments described herein. For example, the gate electrode 195 can include tungsten (W). Moreover, the gate electrode 195 can be formed using any suitable process in accordance with the embodiments described herein.

FIGS. 7-18 depict respective steps of a process flow for fabricating a semiconductor device to enable multi-Vt, in accordance with one embodiment of the present invention.

Figures 7, 8, 9:
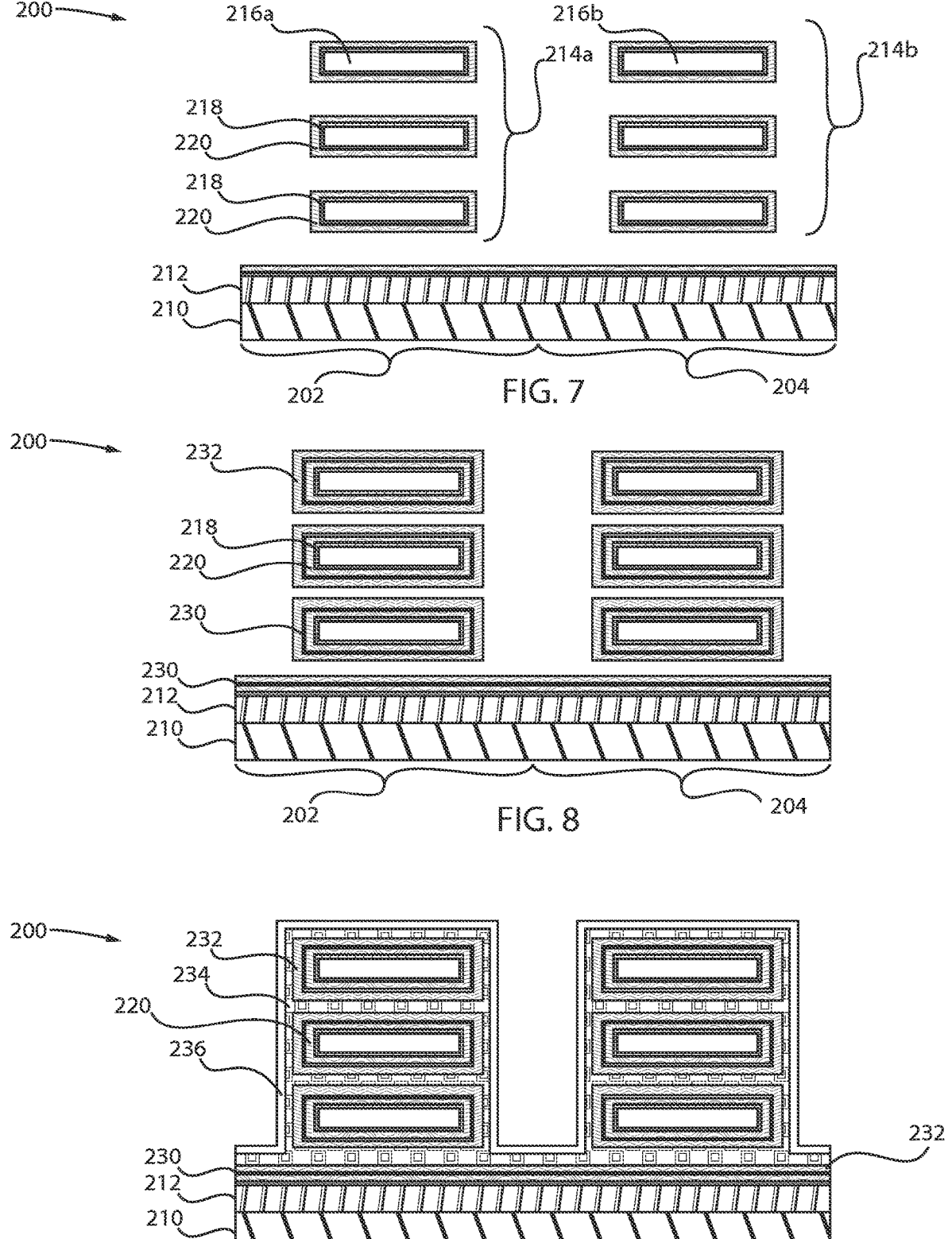
FIG. 7 is a cross-sectional view of an interfacial layer and dielectric layer formed on channels of gate stacks of devices during the fabrication of the semiconductor device, in accordance with another embodiment of the present invention.
FIG. 8 is a cross-sectional view of a dipole layer and a barrier layer formed on the dipole layer during the fabrication of the semiconductor device, in accordance with another embodiment of the present invention.
FIG. 9 is a cross-sectional view of a sacrificial layer and a patterning cap layer formed on barrier layer during the fabrication of the semiconductor device, in accordance with another embodiment of the present invention.

Referring to FIG. 7, a cross-sectional view is provided showing an exemplary semiconductor device 200 having regions 202 and 204. As will be described in further detail, a first GAA FET device will be formed in region 202 and a second GAA FET device will be formed in region 204. In one embodiment, the devices in regions 202 and 204 can form a CMOS device. The device in region 202 can include a metal capping layer device, and the device in region 204 can include a no metal capping layer device. Although only two regions 202 and 204 are shown in this illustrative embodiment, the device 200 can include additional regions.

As shown, the device 200 includes a base structure including a substrate 210 and an isolator layer 212, similar to the substrate 110 and isolator layer 120 described above with reference to FIG. 1.

The device further includes a gate stack 214a including a plurality of channels (e.g., channel 216a) formed in region 202, and a gate stack 214b including a plurality of channels (e.g., channel 216b) formed in region 204. In one embodiment, the gate stacks 214a and 214b include nanosheets. One or more of the channels can include Si. However, any material suitable for use as a channel material can be used in accordance with the embodiments described herein. The channels of the gate stacks 214a and 214b have surrounding material removed, but are supported at locations not depicted in the cross-sectional view. Although three channels are shown in each region 202 and 204, the number of channels in each region 202 and 204 should not be considered limited. Moreover, although the regions 202 and 204 are each shown including an equal number of channels, in some embodiments, the number of channels in region 202 can be different from the number of channels in region 204. be different from one another.

As further shown, an IL 218 is formed around each of the channels and on the isolator layer 212, and a dielectric layer 220 is formed on the IL 212, similar to the IL 140 and the dielectric layer 150 described above with reference to FIG. 1.

Referring to FIG. 8, a dipole layer 230 is formed on the dielectric layer 220, and a barrier layer 232 is formed on the dipole layer 230. The dipole layer 230 can include any suitable material in accordance with the embodiments described herein. For example, the dipole layer 230 can include at least one of, e.g., $Al_2O_3$, MgO, $Y_2O_3$, and $La_2O_3$. The barrier layer 232 can include any suitable material in accordance with the embodiments described herein. For example, the barrier layer 232 can include TiN.

Referring to FIG. 9, a sacrificial layer 234 is formed on the barrier layer 232, and a patterning cap layer 236 is formed on the sacrificial layer 234. For example, the sacrificial layer 234 can include an oxide, such as SiO2, $Al_2O_3$, $La_2O_3$, etc. The patterning cap layer 236 can include, e.g., TiN.

Figures 10, 11, 12:
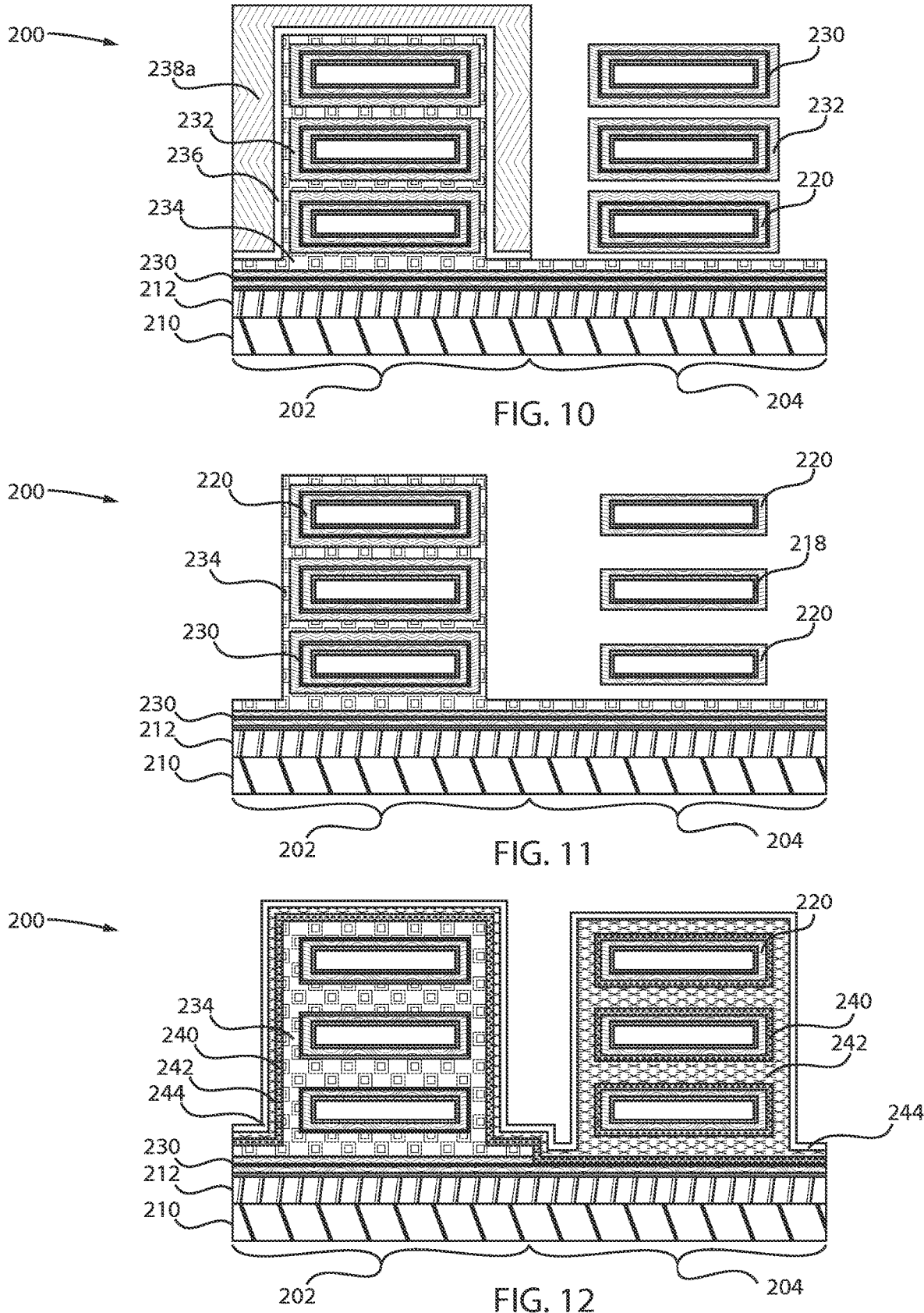
FIG. 10 is a cross-sectional view of a mask formed in a first region during the fabrication of the semiconductor device, in accordance with another embodiment of the present invention.
FIG. 11 is a cross-sectional view of the removal of material in the first region and a second region during the fabrication of the semiconductor device, in accordance with another embodiment of the present invention.
FIG. 12 is a cross-sectional view of a sacrificial stack formed in the first and second regions during the fabrication of the semiconductor device, in accordance with another embodiment of the present invention.

Referring to FIG. 10, a mask 238a is formed to protect region 202 during processing performed to open the device being formed in region 204. The mask 238a can include any suitable material in accordance with the embodiments described herein. Then, the portion of the patterning cap layer 236 and the sacrificial layer 234 corresponding to region 204 is removed using any suitable processes in accordance with the embodiments described herein.

Referring to FIG. 11, the portion of the barrier layer 232 and the dipole layer 230 corresponding to the region 204 is removed, as well as the mask 238a and the portion of the patterning cap layer 236 corresponding to region 202, using any suitable processes in accordance with the embodiments described herein.

Referring to FIG. 12, a stack including a sacrificial layer 242 formed between barrier layers 240 and 244 is formed on the sacrificial layer 234 in region 202 and on the dielectric layer 220 in region 204. The layers 240-244 can include any suitable material in accordance with the embodiments described herein. For example, the barrier layers 240 and 244 can include TiN. The sacrificial layer 242 can include an oxide, such as SiO2, $Al_2O_3$, $La_2O_3$, etc.

Figures 13, 14, 15:
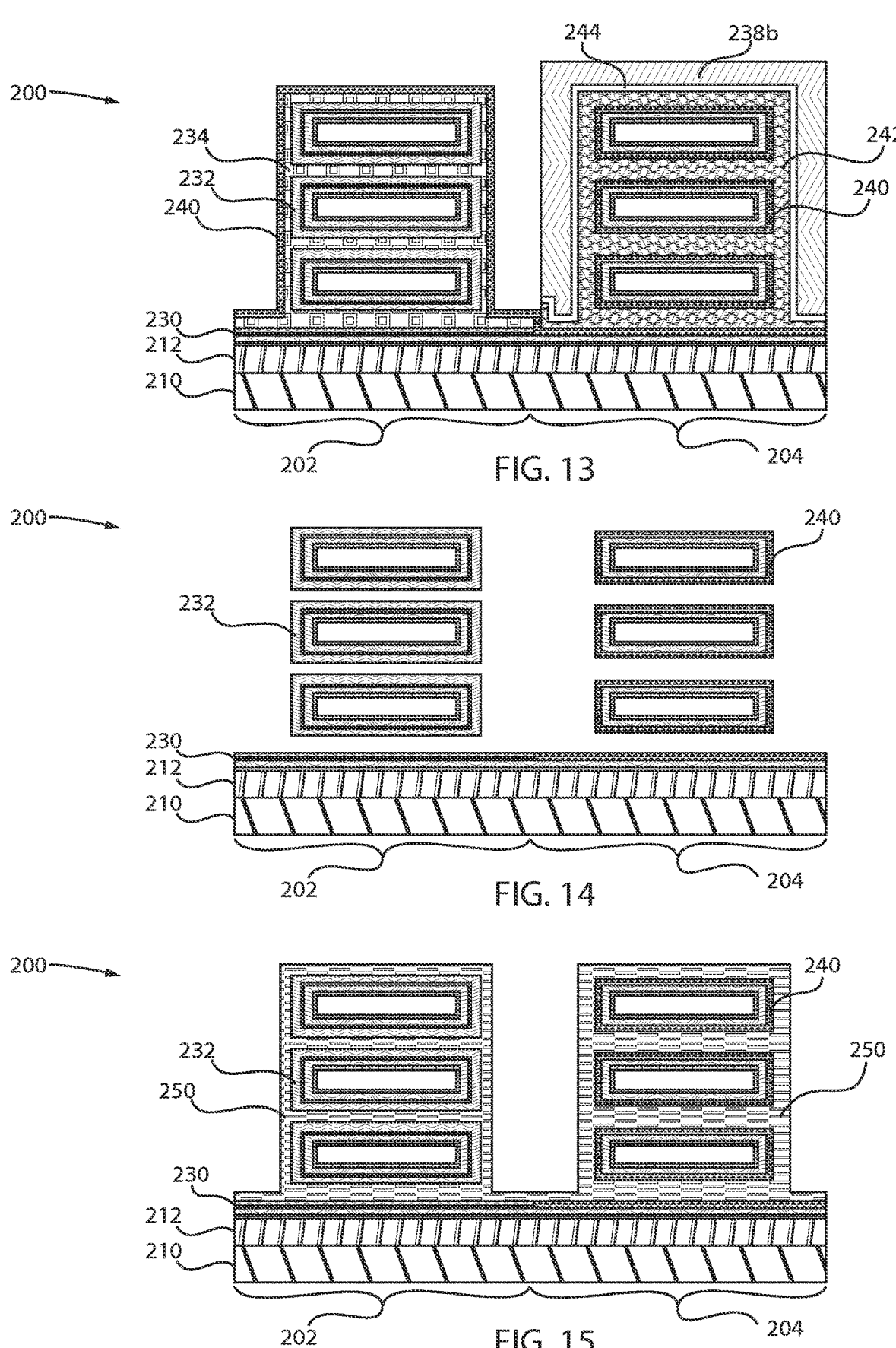
FIG. 13 is a cross-sectional view of a mask formed in the second region and material removed from the first region during the fabrication of the semiconductor device, in accordance with another embodiment of the present invention.
FIG. 14 is a cross-sectional view of the removal of material from the first and second regions during the fabrication of the semiconductor device, in accordance with another embodiment of the present invention.
FIG. 15 is a cross-sectional view of a scavenging metal layer formed in the first and second regions during the fabrication of the semiconductor device, in accordance with another embodiment of the present invention.

Referring to FIG. 13, a mask 238b is formed to protect region 204 during processing performed to open the device being formed in region 202. The mask 238b can include any suitable material in accordance with the embodiments described herein. Then, the portions of the layer 244 and the sacrificial layer 242 corresponding to region 202 are removed using any suitable processes in accordance with the embodiments described herein.

Referring to FIG. 14, the mask 238b is removed using any suitable process in accordance with the embodiments described herein (e.g., ashing). Then, the layers 240 and 234 are removed from the region 202 and the layers 244 and 242 is removed from the region 204 using any suitable processes in accordance with the embodiments described herein.

Referring to FIG. 15, a scavenging metal layer 250 formed in regions 202 and 204 to pinch off the space or gap between the channels of the gate stacks 214a and 214b. The scavenging metal layer 250 can include a material similar to that included in the scavenging metal layer 170 described above in FIG. 2.

Figures 16, 17, 18:
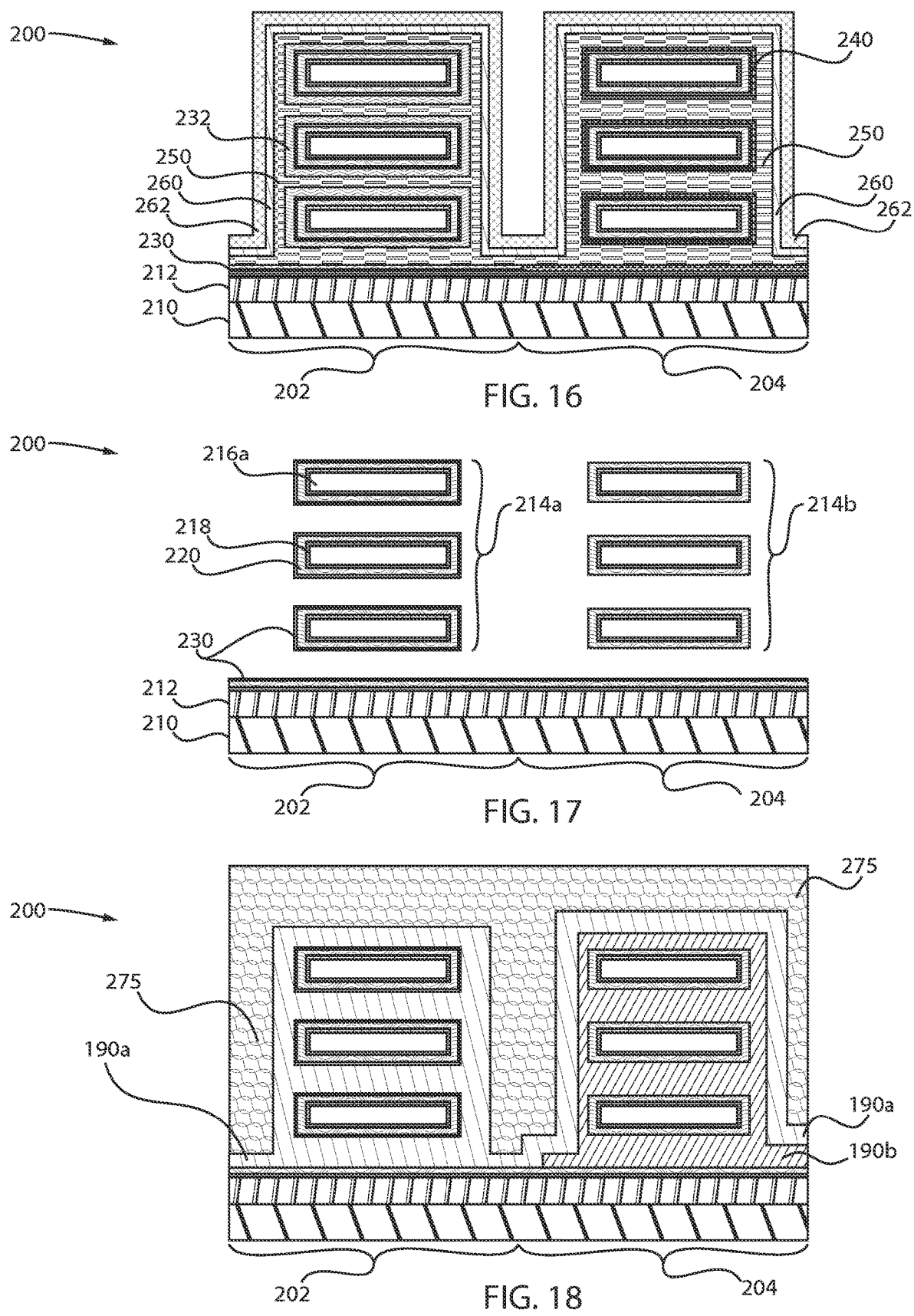
FIG. 16 is a cross-sectional view of at least one cap layer formed on the scavenging metal layer during the fabrication of the semiconductor device, in accordance with another embodiment of the present invention.
FIG. 17 is a cross-sectional view of the removal of material from the first and second regions after an anneal process is performed during the fabrication of the semiconductor device, in accordance with another embodiment of the present invention.
FIG. 18 is a cross-sectional view of dual work function metal and gate electrode formation during the fabrication of the semiconductor device, in accordance with another embodiment of the present invention.

Referring to FIG. 16, an optional cap layer 260 is formed on the scavenging metal layer 250, and a cap layer 262 is formed on the optional cap layer 260. The layers 260 and/or 262 are formed to protect the IL being regrown in regions 202 and 204 during a subsequent anneal process. The layers 260 and 262 can include any suitable material in accordance with the embodiments described herein. For example, the layers 260 and 262 can include, e.g., TiN.

Referring to FIG. 17, an anneal process is performed using any suitable process in accordance with the embodiments described herein. The anneal process can include reliability annealing, similar to that described above in FIG. 4. Furthermore, a drive-in of the dipole layer 230 is performed. Accordingly, the dipole layer 230 is diffused below the dielectric layer 220. After the anneal process is performed, all the layers up to the dielectric layer 220 in region 202 and in region 204 are removed using any suitable processes in accordance with the embodiments described herein.

Referring to FIG. 18, a dual work function metal (WFM) formation process is performed. For example, as shown, WFM 270b is formed on the dielectric layer 220 to pinch off the space or gap between the channels formed in region 204 and WFM 270a is formed on the dielectric layer 220 to pinch off the space or gap between the channels formed in region 202. In one embodiment, the WFM 270a corresponds to a low WFM gate, and the WFM 270b corresponds to a high WFM gate. The WFM 270a can include an n-type WFM (NWFM) and the WFM 270b can include a p-type WFM (PWFM). The WFM 270a could be composed of a stack including a barrier nitride layer (e.g., titanium nitride (TiN)) and a scavenging metal (e.g., Ti, Al, TaAl, TiAl, TaAlC, TiAlC). In one embodiment, a thicker nWFM, such as, e.g., Ti, Al, TiAl, TaAl, TaAlC, and TiAlC, can be used to pinch off the space between the nanosheets. The WFM 190b can include a metal nitride e.g., TiN or TaN. Moreover, the WFMs 270a and 270b can be formed using any suitable process in accordance with the embodiments described herein. Additionally, a gate electrode 275 can be formed on the WFM layers 270a and 270b. The gate electrode 275 can include any suitable material in accordance with the embodiments described herein. For example, the gate electrode 275 can include tungsten (W). Moreover, the gate electrode 275 can be formed using any suitable process in accordance with the embodiments described herein. Accordingly, a first GAA device is formed in the region 202 and a second GAA device is formed in the region 204.

The dipole layer 230 is shown in region 202 (e.g., the nFET region of the device 200) such that regions 202 and 204 have respective first Vt's in this multi-Vt scheme (e.g., a lower Vt device). However, in an alternative embodiment, the device 200 can be processed in accordance with the embodiments described herein such that the dipole layer 230 is located within region 204 (e.g., the pFET region of the device 200). Accordingly, regions 202 and 204 can have respective second Vt's in accordance with this alternative multi-Vt scheme (e.g., a higher Vt device).

FIGS. 7-18 describe a double patterning scheme to enable multi-Vt. In this embodiment, the scavenging metal stack in the device regions is removed after the anneal process is performed. However, in an alternative embodiment, such as the embodiment that will now be described with reference to FIGS. 19-22, the scavenging metal stack can be left within the device regions.

Referring to FIG. 19, a semiconductor device 300 having regions 302 and 304 is shown. As will be described in further detail, a first GAA FET device will be formed in region 302 and a second GAA FET device will be formed in region 304. In one embodiment, the devices in regions 302 and 304 can form a CMOS device. The device in region 302 can include a metal capping layer device, and the device in region 304 can include a no metal capping layer device. Although only two regions 302 and 304 are shown in this illustrative embodiment, the device 300 can include additional regions.

The device 300 is similar to the device 200 described above with reference to FIG. 16. That is, it is assumed that in this illustrative embodiment, that the steps described in FIGS. 7-16 have been performed up to this point to process the device 300 shown in FIG. 19.

Referring to FIG. 20, an anneal process is performed using any suitable process in accordance with the embodiments described herein. The anneal process can include an anneal process similar to that described above in FIG. 4. After the anneal process is performed, the cap layer 262 is removed using any suitable processes in accordance with the embodiments described herein.

Referring to FIG. 21, a wetting layer 310 is formed. The wetting layer 310 can include a metal material that functions to prevent diffusion of metal ions. The wetting layer 310 can include any suitable material in accordance with the embodiments described herein. and can be formed using any process, in accordance with the embodiments described herein. For example, a wetting layer 310 can include a metal nitride (e.g., TiN).

Figures 22, 23, 24:
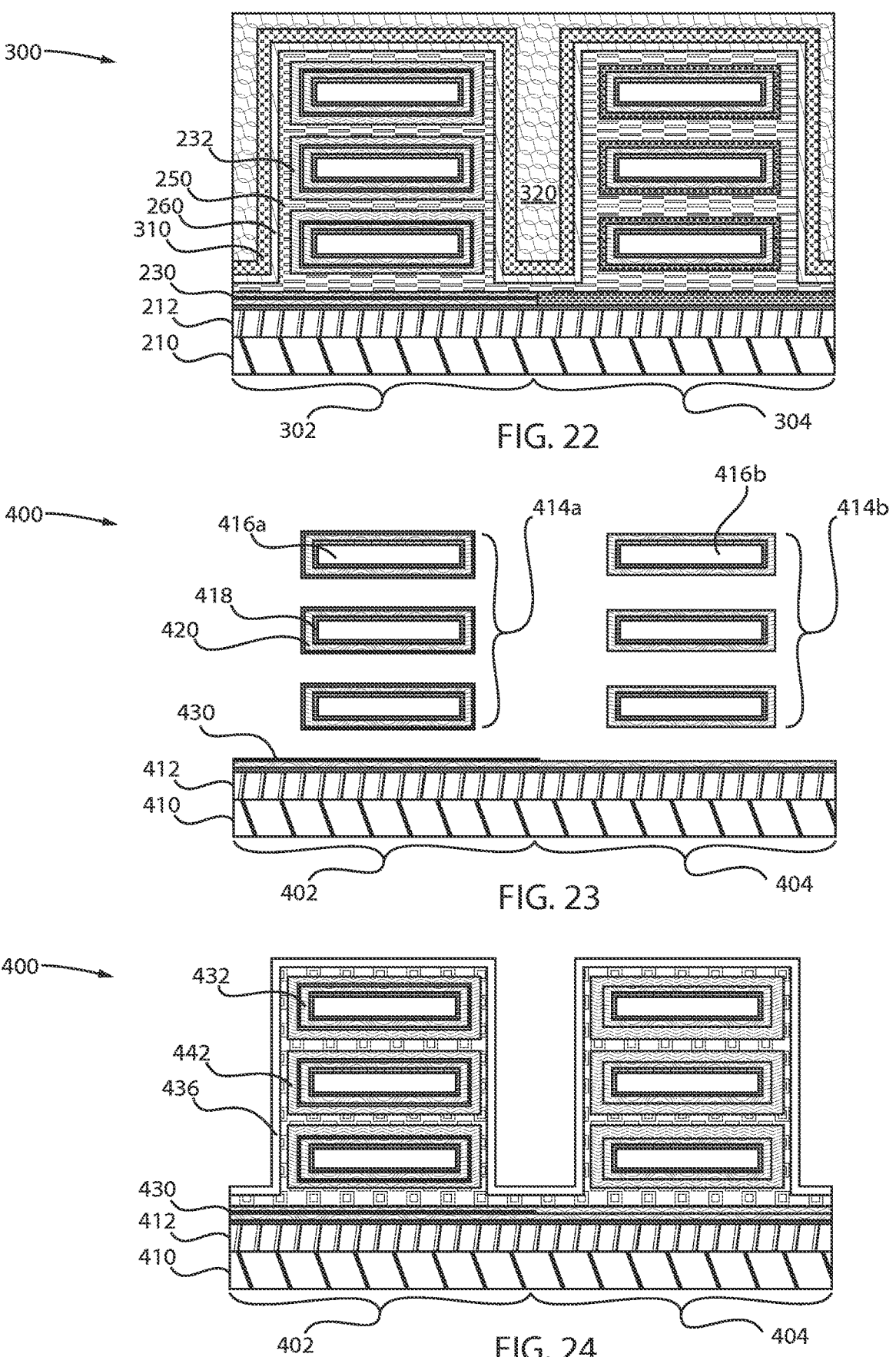
FIG. 22 is a cross-sectional view of a gate electrode formed on the wetting layer during the fabrication of the semiconductor device, in accordance with an alternative embodiment of the present invention.
FIG. 23 is a cross-sectional view of an interfacial layer and dielectric layer formed on channels of gate stacks in first and second regions and a dipole layer formed on the dielectric layer in the first region during the fabrication of the semiconductor device, in accordance with yet another embodiment of the present invention.
FIG. 24 is a cross-sectional view of a sacrificial stack formed in the first and second regions during the fabrication of the semiconductor device, in accordance with yet another embodiment of the present invention.

Referring to FIG. 22, a gate electrode 320 can be formed on the wetting layer 310. The gate electrode 320 can include any suitable material in accordance with the embodiments described herein. For example, the gate electrode 320 can include tungsten (W). Moreover, the gate electrode 320 can be formed using any suitable process in accordance with the embodiments described herein. Accordingly, a first GAA device is formed in the region 302 and a second GAA device is formed in the region 304.

FIGS. 23-27 depict respective steps of a process flow for fabricating a semiconductor device to enable multi-Vt, in accordance with another embodiment of the present invention.

Referring to FIG. 23, a cross-sectional view is provided showing an exemplary semiconductor device 400 having regions 402 and 404. As will be described in further detail, a first GAA FET device will be formed in region 402 and a second GAA FET device will be formed in region 404. In one embodiment, the devices in regions 402 and 404 can form a CMOS device. The device in region 402 can include a metal capping layer device, and the device in region 404 can include a no metal capping layer device. Although only two regions 402 and 404 are shown in this illustrative embodiment, the device 400 can include additional regions.

As shown, the device 400 includes a base structure including a substrate 410 and an isolator layer 412, similar to the substrate 110 and isolator layer 120 described above with reference to FIG. 1.

The device further includes a gate stack 414a including a plurality of channels (e.g., channel 416a) formed in region 402, and a gate stack 414b including a plurality of channels (e.g., channel 416b) formed in region 404. In one embodiment, the gate stacks 414a and 414b include nanosheets. One or more of the channels can include Si. However, any material suitable for use as a channel material can be used in accordance with the embodiments described herein. The channels of the gate stacks 414a and 414b have surrounding material removed, but are supported at locations not depicted in the cross-sectional view. Although three channels are shown in each region 402 and 404, the number of channels in each region 402 and 404 should not be considered limited. Moreover, although the regions 402 and 404 are each shown including an equal number of channels, in some embodiments, the number of channels in region 402 can be different from the number of channels in region 404. be different from one another.

An IL 418 is formed around each of the channels and on the isolator layer 412, and a dielectric layer 420 is formed on the IL 418, similar to the IL 140 and the dielectric layer 150 described above with reference to FIG. 1. A dipole layer 430 is formed on the dielectric layer 420, similar to the dipole layer 230 described above with reference to FIG. 8.

Referring to FIG. 24, a stack including a barrier layer 432, a sacrificial layer 434 and a pattern cap layer 436 is formed, similar to the barrier layer 232, sacrificial layer 234 and the patterning cap layer 236 described above with reference to FIGS. 8 and 9.

Figures 25, 26, 27:
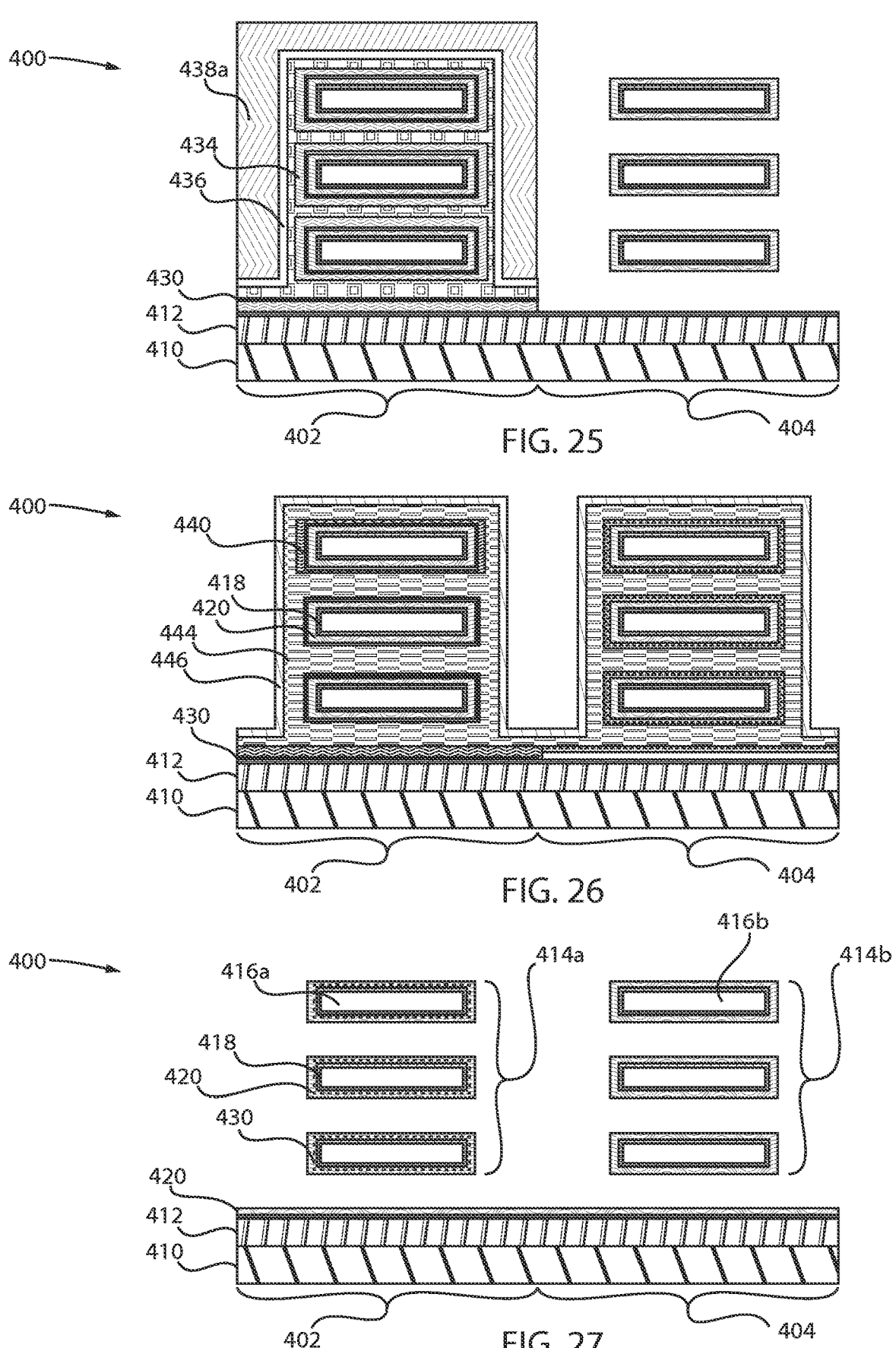
FIG. 25 is a cross-sectional view of a mask formed in the first region and the removal of the sacrificial stack from the second region during the fabrication of the semiconductor device, in accordance with yet another embodiment of the present invention.
FIG. 26 is a cross-sectional view of a scavenging metal stack and cap layer formed during the fabrication of the semiconductor device, in accordance with yet another embodiment of the present invention.
FIG. 27 is a cross-sectional view of the removal of material from the first and second regions after an anneal process is performed during the fabrication of the semiconductor device, in accordance with yet another embodiment of the present invention.

Referring to FIG. 25, a mask 438a, similar to the mask 238a described above with reference to FIG. 10, is formed to protect region 402 during processing performed to open the device being formed in region 404. Then, the stack including the layers 432-436 is removed from the region 404 using any suitable processes in accordance with the embodiments described herein.

Referring to FIG. 26, the mask 438a and the portion of the patterning cap layer 436 and the sacrificial layer 434 corresponding to region 202 are removed using any suitable processes in accordance with the embodiments described herein. Then, a stack including a scavenging metal layer 442 is formed between layers 440 and 444, similar to the stack including the scavenging metal layer 170 formed between layers 160 and 180 described above with reference to FIG. 2, is formed on the barrier layer 432 in region 402 and the dielectric layer 420 in region 404. A cap layer 446, similar to the cap layer 185 of FIG. 3, is formed on the layer 444 to protect the devices being formed in the regions 402 and 404 during a subsequent anneal process.

Referring to FIG. 27, a drive-in anneal is performed to drive-in the dipole layer 430. After the drive-in anneal is performed, all the layers up to the dielectric layer 420 are removed from regions 402 and 404. Further processing steps can be performed on the device 400 (e.g., dual WFM formation and gate electrode formation in the regions 402 and 404 similar to that described above with reference to FIG. 6).

The dipole layer 430 is shown in region 402 (e.g., the nFET region of the device 400) such that regions 402 and 404 have respective first Vt's in this multi-Vt scheme (e.g., a lower Vt device). However, in an alternative embodiment, the device 400 can be processed such that the dipole layer 430 is located within region 404 (e.g., the pFET region of the device 400) such that regions 402 and 404 have respective second Vt's in this alternative multi-Vt scheme (e.g., a higher Vt device).

Having described preferred embodiments of a semiconductor device and a method of fabricating a semiconductor device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed:

1. A semiconductor device providing a multiple threshold voltage (Vt) scheme, comprising:

a first gate-all-around field-effect transistor (GAA FET) device having a first Vt disposed on a first region of a substrate, the first GAA FET device including:

a plurality of first channels;

an interfacial layer around each of the plurality of the first channels;

a dielectric layer around the interfacial layer;

a dipole layer around the plurality of first channels, between the plurality of first channels and the dielectric layer; and a first work function metal between each adjacent pair of the plurality of first channels; and a second GAA FET device having a second Vt different from the first Vt disposed on a second region of the substrate, the second GAA FET device including:

a plurality of second channels with no dipole layer around them;

a second work function metal between each adjacent pair of the plurality of second channels; and the first work function metal on the second work function metal.

2. The semiconductor device of claim 1, wherein the plurality of first channels are nanosheets, and the plurality of second channels are nanosheets.

3. The semiconductor device of claim 2, further comprising an isolator layer on the substrate, wherein the isolator layer separates the first work function metal and the second work function metal from the substrate.

4. The semiconductor device of claim 3, further comprising a gate electrode on and in electrical contact with the first work function metal.

5. The semiconductor device of claim 4, further comprising another dipole layer on the isolator layer.

6. The semiconductor device of claim 5, wherein the isolator layer is hafnium silicate.

7. The semiconductor device of claim 5, wherein the first GAA FET device is an n-type FET (nFET) and the second GAA FET device is a p-type FET (pFET).

8. The semiconductor device of claim 5, wherein the first GAA FET device is a p-type FET (pFET) and the second GAA FET device is an n-type FET (nFET).

9. The semiconductor device of claim 5, wherein the first work function metal is titanium nitride (TiN).

10. The semiconductor device of claim 9, wherein the second work function metal is tantalum nitride (TaN).

11. A semiconductor device providing a multiple threshold voltage (Vt) scheme, comprising:

a first gate-all-around field-effect transistor (GAA FET) device disposed on a base structure in a first region and associated with a first Vt, the first GAA FET device including:

a plurality of first channels;

an interfacial layer around each of the plurality of the first channels;

a dielectric layer around the interfacial layer;

a dipole layer around the plurality of first channels, between the plurality of first channels and the dielectric layer; and a first work function metal pinching off gaps between the plurality of first channels;

a second GAA FET device disposed on the base structure in a second region and associated with a second Vt, the second GAA FET device including:

a plurality of second channels with no dipole layer around them;

a second work function metal pinching off gaps between the plurality of second channels; and the first work function metal on the second work function metal; and a gate electrode on the first work function metal.

12. The device of claim 11, wherein the plurality of first channels and the plurality of second channels are nanosheets, and wherein the base structure includes an isolator layer on a substrate.

13. The device of claim 11, wherein the first GAA FET device is an n-type FET (nFET) and the second GAA FET device is a p-type FET (pFET).

14. The device of claim 11, wherein the first GAA FET device is a p-type FET (pFET) and the second GAA FET device is an n-type FET (nFET).

15. A semiconductor device providing a multiple threshold voltage (Vt) scheme, comprising:

a first gate-all-around field-effect transistor (GAA FET) device disposed on a base structure in a first region and associated with a first Vt, the first GAA FET device including:

a plurality of first channels;

an interfacial layer around each of the plurality of first channels;

a dielectric layer around the interfacial layer;

a dipole layer around the plurality of first channels, between the plurality of first channels and the dielectric layer;

a first barrier layer on the dipole layer;

a scavenging metal layer on the first barrier layer;

a wetting layer on the scavenging metal layer around the plurality of first channels; and a first work function metal between each adjacent pair of the plurality of first channels; and a second GAA FET device disposed on the base structure in a second region and associated with a second Vt, the second GAA FET device including:

a plurality of second channels with no dipole layer around them;

a second barrier layer on the plurality of second channels;

the scavenging metal layer on the second barrier layer;

the wetting layer on the scavenging metal layer;

a gate electrode on the wetting layer;

a second work function metal between each adjacent pair of the plurality of second channels; and the first work function metal on the second work function metal.

16. The device of claim 15, wherein the plurality of first channels and the plurality of second channels include nanosheets, and wherein the base structure includes an isolator layer on a substrate.

17. The device of claim 15, wherein the first GAA FET device includes an n-type FET (nFET) and the second GAA FET device includes a p-type FET (pFET).

18. The device of claim 15, wherein the first GAA FET device includes a p-type FET (pFET) and the second GAA FET device includes an n-type FET (nFET).

19. The device of claim 15, further comprising a cap layer disposed between the wetting layer and the scavenging metal layer.

* * * * *